United States Patent [19]

Endriz et al.

[11] Patent Number: 5,657,153

[45] Date of Patent: Aug. 12, 1997

[54] OPTICAL AMPLIFIER WITH COMPLEMENTARY MODULATION SIGNAL INPUTS

[75] Inventors: John Endriz, Belmont; David F. Welch, Menlo Park; Robert G. Waarts, Palo Alto; Steven Sanders, Mountain View; Donald R. Scifres, San Jose, all of Calif.

[73] Assignee: SDL, Inc., San Jose, Calif.

[21] Appl. No.: 408,030

[22] Filed: Mar. 21, 1995

[51] Int. Cl.$^6$ .................. H01S 3/00; H04B 10/04
[52] U.S. Cl. ............... 359/341; 359/333; 359/180; 359/181
[58] Field of Search ..................... 359/113, 114, 359/123, 132, 133, 134, 181, 182, 333, 341, 186

[56] References Cited

U.S. PATENT DOCUMENTS

| | | | |
|---|---|---|---|
| 3,600,537 | 8/1971 | Smith | 325/30 |
| 5,005,175 | 4/1991 | Desurvire et al. | 372/6 |
| 5,058,977 | 10/1991 | Sorin | 385/30 |
| 5,106,193 | 4/1992 | Fesler et al. | 356/350 |
| 5,189,676 | 2/1993 | Wysocki et al. | 372/6 |
| 5,212,709 | 5/1993 | Mihm | 372/69 |
| 5,293,547 | 3/1994 | Gysel et al. | 359/337 |
| 5,299,048 | 3/1994 | Suyama | 359/179 |
| 5,301,054 | 4/1994 | Huber et al. | 359/132 |
| 5,331,449 | 7/1994 | Huber et al. | 359/125 |
| 5,337,175 | 8/1994 | Ohnsorge et al. | 359/125 |
| 5,339,183 | 8/1994 | Suzuki | 359/123 |
| 5,416,625 | 5/1995 | Cavaciuti et al. | 359/137 |
| 5,416,629 | 5/1995 | Huber | 359/182 |
| 5,418,869 | 5/1995 | Seike et al. | 385/24 |
| 5,438,444 | 8/1995 | Tayonaka et al. | 359/123 |
| 5,510,919 | 4/1996 | Wedding | 359/115 |

*Primary Examiner*—Mark Hellner
*Attorney, Agent, or Firm*—Thomas Schneck

[57] ABSTRACT

In an optical transmission medium, such as a fiber amplifier, two optically distinguishable signals with complementary modulation are both inputted into the amplifying medium for encoding information, particularly a serial stream of digital data, or alternatively, redundant encoding of pulses. The gain profile in the medium is preferably maintained approximately constant at all times, so that whichever amplified signal is used as the primary information carrier, its output intensity will be substantially stable from pulse to pulse, independent of recent pulse history. The two complementary signals may have different orthogonal linear polarizations or wavelengths with the same stimulated emission cross-section, so that the population inversion profile stays constant, whichever signal happens to be on at a given moment. The two signals may be derived from separate intensity modulated laser diode signal sources, from a single laser diode signal source switched between two emission wavelengths, or from a single laser diode with constant emission coupled to a directional coupler directing two complementary polarized light signals into the fiber amplifying medium.

51 Claims, 5 Drawing Sheets

OPTICAL AMPLIFIER WITH COMPLEMENTARY MODULATION SIGNAL INPUTS

TECHNICAL FIELD

The present invention relates to optical amplifiers, especially fiber amplifiers, and in particular to modulation systems providing output stabilization of the optical signal pulses amplified by such amplifiers.

BACKGROUND ART

Optical fiber amplifiers are used in telecommunications systems to boost the power of an optical signal derived from a modulated laser diode or other laser signal source prior to transmitting the signal along a fiberoptic waveguide. Fiber amplifiers are also used as relay elements to restore the power of the optical signal lost to absorption or scattering while being transmitted along a length of the fiberoptic waveguide. In cable television systems, in which an optical signal is sent to multiple receiving stations, fiber amplifiers restore the power of the signal at each splitting junction, as described, for example, in U.S. Pat. No. 5,331,449 to Huber et al. In fiberoptic telephone systems, wave-length-division multiplexing may be used, as described, for example, in U.S. Pat. No. 5,337,175 to Ohnsorge et al. and U.S. Pat. No. 5,339,183, to send multiple independent optical signals of slightly different wavelengths along the same optical fiber and to both send and receive signals on the same optical fiber in a two-way transmission scheme. Fiber amplifiers are used in such systems both to amplify the outgoing optical signal and to reamplify the incoming signal. Various forms of laser pulse modulation have been used in these fiberoptic systems.

Lasers have also been used in printer applications, where a modulated laser beam scans the photosensitive surface of a drum to produce a charge image of the page to be printed. It would be very desirable to be able to use optical fiber amplifiers with a laser diode signal source and a laser diode pump source in such printer systems. The laser diode signal source is capable of providing a 10 mW to 100 mW, single mode modulated light beam at very high modulation rates (typically greater than 10 MHz) with very low modulated drive currents, which can then be amplified to higher powers (greater than 1 W) by the fiber amplifier. However, one problem with using such a fiber amplifier is that the signal power levels typically deplete the excited state of the dopant ions in the fiber amplifying medium in a very short time compared to normal excited state life-times, so that the population inversion, and consequently the gain, within the fiber amplifier at any given time will depend to a great extent on the recent past history of the signal beam. If the signal source has recently been 'on' for a while, the fiber amplifier will have a smaller population inversion than if the signal source has just been 'off' for an extended time. The gain for the following signal pulses will then be lower. As a result, pulses following an extended on time have amplified intensities which are lower than pulses following an extended off time. This creates added noise in a communications system which may or may not be tolerated, depending on the type of signal modulation. In a printer system, the intensity variations can create noticeable grey scale errors in the printed image. Extended 'on' and 'off' periods are common when printing graphical images. While less common when printing text images or in communications applications, any extended 'on' and 'off' periods can still cause errors when they do occur.

An object of the invention is to provide an optical amplifier modulation system, especially adapted for use with optical fiber amplifiers, providing stable output pulse intensities independent of modulation history.

DISCLOSURE OF THE INVENTION

The object is met with an amplifier system in which two optically distinguishable signals with complementary modulation are input together into an optical amplifying medium so as to maintain an approximately constant population inversion profile at all times. In a preferred digital modulation system, the two distinguishable signals may have either different linear polarizations or different wavelengths, but in either case, the stimulated emission cross-section of the amplifying medium for the two signals must be substantially the same. When one signal source is on, the other is off, so that no matter what the modulation signal is, there is always one and only one laser signal source inputting a light signal. The input intensities of the respective sets of signal pulses should be substantially the same. The population inversion spatial profile, and consequently the gain spatial profile, along the length of the amplifying medium are maintained approximately constant in time, so that whichever one of the two complementary signals is actually used, its amplified output intensity is substantially stable from pulse to pulse. An analog modulation scheme in which a pair of complementary intensity modulated signals are input into the amplifying medium could also be used. The amplifying medium may be an optical fiber amplifier, solid-state amplifier or a semiconductor amplifier. The two signals may be derived from separate laser diodes or from a single laser diode source whose wavelength or polarization can be switched between two states in response to a modulation signal current.

The invention further includes a light transmission system and method for optical digital communications in which a pair of laser signal sources with distinguishable light emission characteristics such as different wavelengths or polarizations, are optically coupled to an optical fiber transmission medium, which preferably includes an optically pumped light amplifying medium. Bipolar modulation means connected to the light sources switch emission between the two sources in a complementary manner such that light output exists from only one source at a time. The switched light emission forms a serial data stream for propagation in the fiber transmission medium.

BEST MODE OF CARRYING OUT THE INVENTION

Figures 1, 2A, 2B:
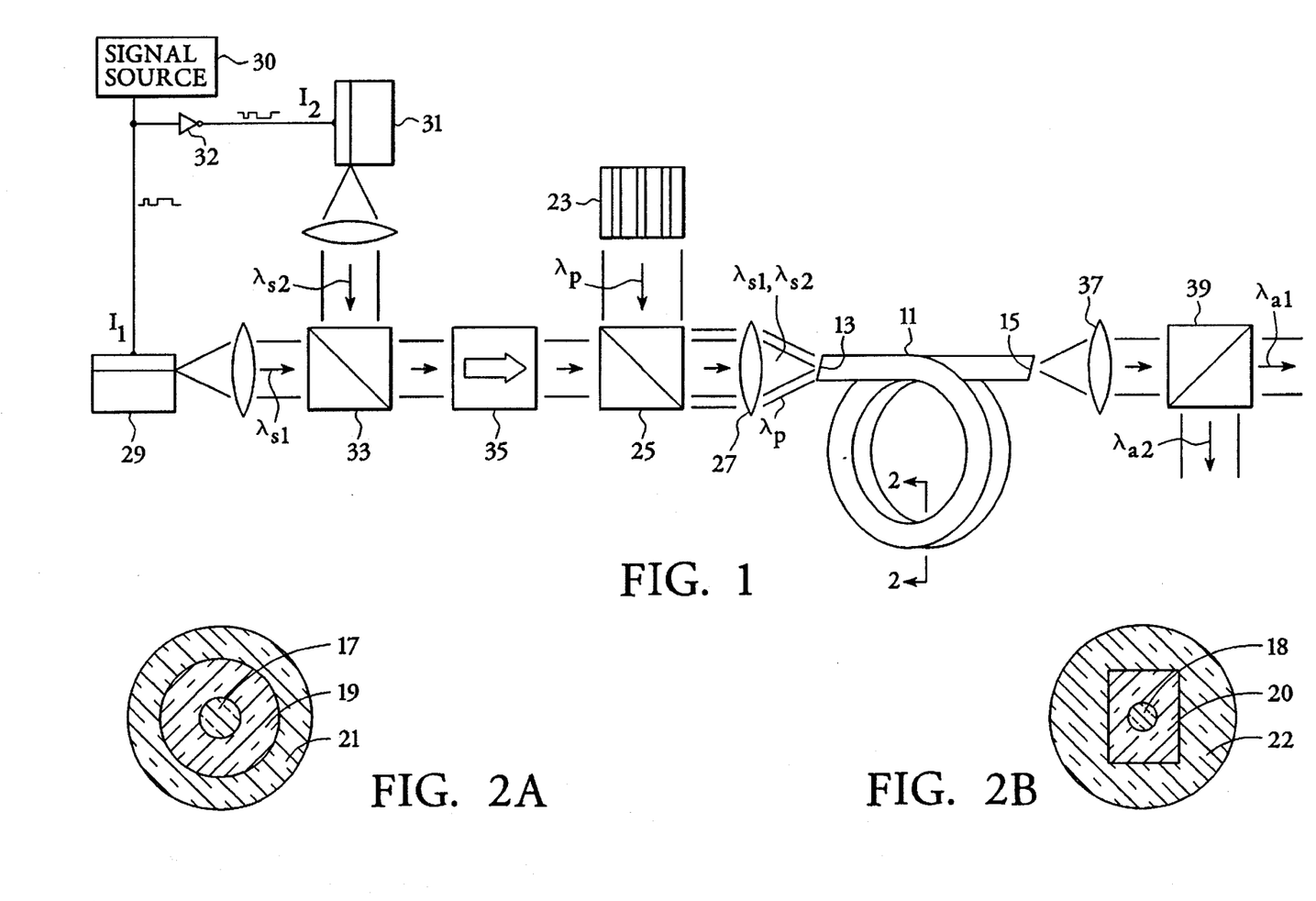
FIG. 1 is a schematic side view of an optical fiber amplifier device of the present invention.
FIGS. 2A and 2B are cross-sectional views of two double-clad optical fibers that can be used in the fiber amplifier device of FIG. 1.

With reference to FIG. 1, one embodiment of an optical amplifying device of the present invention includes an optical fiber amplifying medium 11 having an input end 13 for receiving light to be amplified and an output end 15 for emitting the amplified light. One or both end surfaces 13 and 15 may be formed at an angle, typically about 12° away from the normal orientation relative to the fiber core, in order to minimize or eliminate reflective feedback in the fiber medium 11. The end surfaces 13 and 15 could also be provided with a coating which is anti-reflective at the amplification wavelength(s).

FIG. 2A shows the cross-section of one possible dual-clad optical fiber for use as the fiber amplifying medium 11. Another possible fiber 12 is shown in FIG. 2B. The optical fiber is preferably composed of a silica glass material. The fiber includes a central core 17 or 18 which is doped with an active light amplifying ionic species, such as the rare earth ions, erbium, neodymium, praseodymium, thullium or holmium. The central core 17 or 18 preferably supports only a single spatial mode of light propagation, but alternatively a multimode core could be used instead. Surrounding the central core 17 is a lower refractive index inner cladding 19 or 20, which in turn is surrounded by an even lower refractive index outer cladding 21 or 22. The inner cladding 19 or 20 not only helps to confine the light being amplified to the central core 17 or 18, but also serves to guide pump light received from an external pump source 23, seen in FIG. 1. Pump light propagating within the inner cladding 19 or 20 propagates through and is absorbed in the central core 17 or 18 to create and maintain a population inversion in the rare earth dopant ions for stimulated emission by the light propagating in the central core 17 or 18. Alternatively, a single-clad fiber could be used with the light to be amplified and the pump light being received and guided by a single mode or multimode fiber core. The inner cladding 20 in FIG. 2B is seen to have a rectangular cross-section. This shape has been found to improve coupling of the pump beam from the inner cladding 20 into the fiber core 18. An elliptical or other oblong shape might also be used, if desired, instead of the rectangular shape shown in FIG. 2B. The core region 17 or 18 might also have a rectangular, elliptical or other oblong cross-section. Such a core shape exhibits much better polarization preservation than a circular core cross-section.

Alternatively, instead of an optical fiber, other solid-state amplifying media may also be used with the complementary modulation of the present invention. For example, a solid-state rod of any suitable shape, including cylinders, discs and rectangular bars, can be used in place of any of the fibers shown in the figures. Like the central cores in the optical fibers, such rods are doped with an active ionic species capable of undergoing stimulated emission, such as titanium, chromium or any of several rare-earth ions. Glass media are preferred because of their broader gain spectrum, but crystalline media, particularly vibronic media such as Ti:Sapphire, could be used.

Alternatively, instead of an optically pumped solid-state or fiber amplifier, an electrically pumped semiconductor amplifier may be used with the complementary modulation scheme of the present invention. For example, a semiconductor amplifier can be used in place of the fibers shown in the figures. The main difference between a semiconductor amplifier and the other amplifying media with respect to the present invention is the much shorter time constant of the semiconductor amplifier. Semiconductor amplifiers have a typical carrier lifetime of about 1 to 10 nsec compared to the typical excited state lifetimes in solid state media of about 0.1 to 1 msec. In addition, a semiconductor amplifier with a typical length of from 0.1 to several millimeters has a transit time which is much shorter than that for solid-state amplifiers, and especially fiber amplifiers.

Returning to FIG. 1, the optical pump source 23 is preferably a high power (1 W cw or more), high brightness laser diode source, such as a lensed or fiber-coupled multimode diode array, emitting pump light with a wavelength $\lambda_p$ corresponding to a pump band of the particular rare earth dopant used in the fiber amplifying medium 11. The pump light may be directed into the fiber 11's inner cladding with the help of a dichroic beamsplitter combiner 25 and lens focusing optics 27. While the pump light is shown as being launched into the fiber 11 at the input end 13, that is on the same side as the light to be amplified, it could also be coupled into the fiber at the output end 15 and propagate backwards through the fiber, or be coupled into both ends 13 and 15 of the fiber 11.

A pair of laser signal sources 29 and 31 with distinguishable light emission characteristics are optically coupled to the optical fiber amplifying medium 11. These signal sources 29 and 31 are typically low power (usually 10 to 100 mW) single mode laser diodes, such as distributed feedback (DFB) or distributed Bragg reflector (DBR) lasers, which are capable of being pulse modulated at high data rates (up to 10 Gbits/sec) without any significant wavelength chirp. Such modulation may be carried out directly by modulation of the electrical current $I_1$ and $I_2$ injected into the respective laser diode sources 29 and 31. The modulated current $I_1$ and $I_2$ can be provided by a conventional electrical signal source 30 supplying the first modulated current $I_1$ and an inverter 32 coupled to the signal source 30 for providing the second modulated current $I_2$ in a manner that is complementary to the first current $I_1$. The distinguishable optical characteristic of the light emitted from the two sources 29 and 31 may be wavelength. That is, the first laser diode source 29 may emit modulated light of a first wavelength $\lambda_{s1}$, while the second laser diode 31 may emit modulated light of a second wavelength $\lambda_{s2}$, both wavelengths $\lambda_{s1}$ and $\lambda_{s2}$ being capable of undergoing gain, i.e., being amplified, in the doped fiber core. Alternatively, the distinguishable characteristic may be the relative direction of linear polarization of the emitted light from the two sources. This would require a polarization maintaining fiber. The light from the two sources is combined into a single path by a dichroic or polarizing beamsplitter 33 to form the optical signal to be amplified by the fiber medium 11. An optical isolator 35 may be placed in the combined beam path to prevent any back reflections in the system from affecting the signal modulation of the laser diode sources 29 and 31. The isolator 35, as well as those in the other depicted embodiments, is optional. The signal light is introduced into the fiber core through the dichroic beamsplitter 25 and focusing lens 27.

The amplified light emerging from the output end 15 of the fiber amplifying medium 11 may be collimated by a lens 37 then reseparated into the two original signal components with distinguishable characteristics by means of a filter or beamsplitting element 39. If the distinguishable characteristic is wavelength, a dichroic beamsplitter, like beamsplitter 33, can be used to separate the two amplified wavelengths $\lambda_{a1}$ and $\lambda_{a2}$ into different light paths. One of the amplified signals $\lambda_{a1}$ can be transmitted along a fiberoptic waveguide or directed onto a photosensitive drum of a laser printer or copier, while the other amplified signal $\lambda_{a2}$ can be monitored for data checking purposes as well as to verify that the signal peaks are at the same intensity regardless of signal history, as explained below. A wavelength selective filter, such as an external prism or grating filter, could be used to transmit only one of the amplified signal wavelengths $\lambda_{a1}$. If the distinguishing characteristic is the linear polarization of the light, a polarizing beamsplitter or polarizing filter can be used. Alternatively, in the case of a communications system, the light separating or filtering element may be absent from the immediate end 15 of the amplifying fiber 11 so that both signal components propagate along a fiberoptic waveguide. This is advantageous in the case where additional "relay" amplifiers are placed along the fiberoptic transmission path to boost the signal. The light separating or filtering element can be placed at the receiver end in the path to a detector. If a beamsplitter is used, the separated second signal can again be used for data checking, in this case to verify transmission integrity.

Figure 3A:
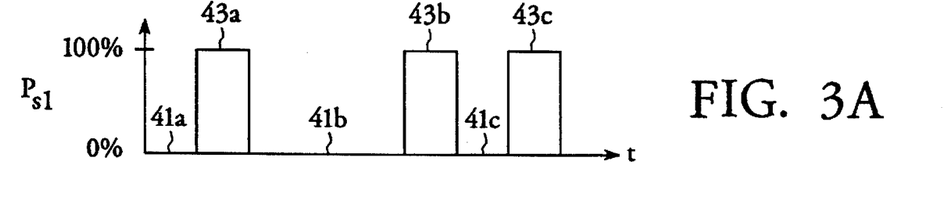
FIGS. 3A–3C are graphs of optical power versus time for light emitted from a pair of laser diode signal sources in the device of FIG. 1 and amplified light emitted from the optical fiber amplifying medium in the device of FIG. 1, respectively, utilizing digital pulse modulation.
Figure 3B:
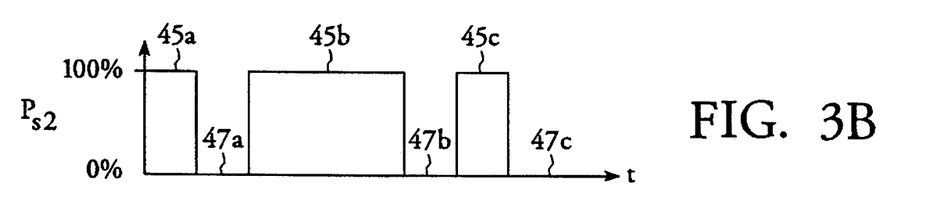
Figure 3C:
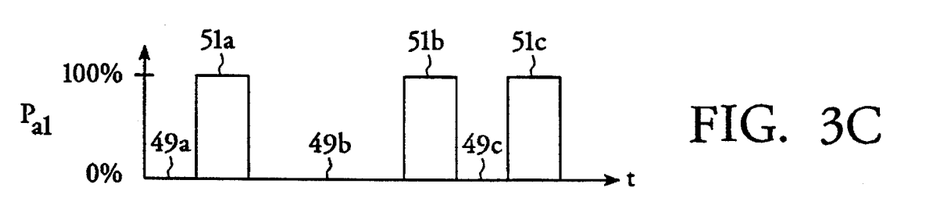

With reference to FIGS. 3A–3C, a principal feature of the invention is the means by which the intensity of the output pulses in a digital pulse modulated signal are stabilized so that the amplified output signal's power levels are kept independent of the pulse history of the signal. The current $I_1$ and $I_2$ injected into the first and second laser diode signal sources 29 and 31 in FIG. 1 are both responsive to a single common modulation signal, provided, for example, by a single common signal source 30, so as to switch the light emission from these sources 29 and 31 in a complementary manner. This complementary modulation is illustrated in FIGS. 3A and 3B for a pulse modulated signal.

In FIG. 3A, the light output power $P_{s1}$ from the first laser diode source 29 has a series of time periods 41a, 41b and 41c when this source 29 is off (or below the lasing threshold) and emits no light (or an insignificant amount of optical power), interleaved with another series of time periods 43a, 43b, 43c during which the laser source 29 is on (above threshold) and emits light with substantially constant power levels sufficient to saturate the gain in the fiber amplifying medium 11 of FIG. 1. A series of constant intensity pulses 43a, 43b, 43c is thus output from the source 29 where information is represented by the pulse spacings (interval). In FIG. 3B, the second laser diode source 31 is modulated so that it is on when the first laser diode source 29 is off, as seen by pulses 45a, 45b and 45c, and off when the first source 29 is on, as seen by the intervals 47a, 47b and 47c when the output power $P_{s2}$ is substantially zero. This complementary modulation may be accomplished, for example, by providing an inverter 32 in the current path between the signal source 30 and the second laser diode 31 to convert the modulated current $I_1$ supplied to the first laser diode 29 into a complementary current signal $I_2$ for the second laser diode 31. The information in this signal is represented by the pulse duration (width). We note that other forms of pulse modulation which represent the information in the signal by the pulse frequency (repetition rate), pulse position (displacement) or by a pulse code using different numbers of pulses in a string could also be used to modulate the sources 29 and 31, provided one source is on while the other off. For example, in a laser printer application, grey scale in an image can be represented with pulse frequency modulation, where a higher pulse frequency creates a higher density of laser spots on a printing surface. Gray scale could also be represented by analog amplitude modulation of the signal's amplified output intensity. In this case, the complementary intensity modulation of the second signal input helps to ensure linearity in the first input signal's amplification. The complementary modulation in an analog system can be provided by replacing the digital inverter circuit 32 of FIG. 1 with an inverting amplifier having substantially linear characteristics with negative unity gain.

The amplified output power $P_{a1}$ corresponding to the input signal $P_{s1}$ from the first laser diode source 29 is seen in FIG. 3C. Since it is derived from the light emission from the first source 29, the amplified output $P_{a1}$ exhibits pulses 51a, 51b and 51c at the same time as the first input signal $P_{s1}$ and interpulse periods of substantially zero optical power 49a, 49b and 49c at the same time as the intervals 41a, 41b and 41c between pulses in the input signal $P_{s1}$. The amplified light corresponding to the second source 31 will similarly display amplified pulses coinciding with the input pulses 45a, 45b and 45c in the complementary second signal $P_{s2}$. The complementary manner in which the two signal sources 29 and 31 are modulated is such that the total amplified output power is approximately constant, that is, has a maximum power variation of about 20% or less. For digital communications, small variations are acceptable because it is still possible to distinguish pulses (ones) from interpulse intervals (zeros) in either of the two complementary signals, even with power fluctuations of as much as 20%. In fact, the light from the complementarily switched sources with its correspondingly switched characteristics (wavelength or polarization) can itself represent the signal, so that power fluctuations are less a source of noise than wavelength fluctuations. For laser printing applications, however, the grey scale of a printed image is sensitive to changes in brightness and intensity of the amplified signal pulses, so that fluctuations of more than 2% may produce noticeable errors in the printed image. Thus, in this case the total amplified power should be maintained substantially constant to 2% or in some cases much less than 1%. Other applications of the fiber amplified light may require different levels of pulse stability.

The condition for maintaining stable pulse intensity for the amplified fiber output is that the two modulated input signals $\lambda_{s1}$ and $\lambda_{s2}$ from the pair of signal sources 29 and 31 should have an intensity and correspond to a gain within the fiber amplifying medium 11 that maintains the population inversion's spatial profile in the fiber medium 11 approximately constant with time. The "spatial profile" of the population inversion is the spatial variation along the length of the amplifying medium 11 of the excited state population relative to the ground state population of the active species in the medium that are capable of undergoing stimulated emission and thereby providing light amplification of light propagating in the medium. The exact profile will depend on factors such as the input intensity, the medium's absorption coefficient and the direction (from the signal input end, output end or both) of the pump light, as well as the input intensity and gain of the signal pulses. However, because the signal light is being amplified as it propagates through the medium 11, the population inversion will generally not be spatially constant along the length of the medium, but will normally decrease toward the output end of the amplifying medium. However, what is important to the present invention, is that the population inversion at every point along the length of the medium be constant in time. The less the time variation in the population inversion, the more stable the output. This, in turn, requires that the rate of depletion of the population inversion by the light pulses from one signal source 29 approximately equal the rate of depletion of the population inversion by the light pulses from the other signal source 31, so that no matter which source 29 or 31 is on at any moment, the population depletion is exactly balanced by the constant population replenishment provided by the pump source 23's constant output.

One way to accomplish this is to ensure that both the intensity of the input light pulses from the two signal sources 29 and 31 and the gain for both light signals within the amplifying medium 11 are substantially the same. In the case of sources with polarization distinguishable signals with the same wavelength, the gain in a fiber amplifying medium is independent of polarization direction, and so the pulse intensity of the two signal sources should be approximately the same (to within 20%) and preferably substantially the same (to 2% or less). In the case where the sources provide wavelength distinguishable signals, the two wavelengths $\lambda_{s1}$ and $\lambda_{s2}$ can be on opposite sides of the gain peak of the fiber amplifying medium, so that they correspond to at least approximately the same stimulated emission cross-section and gain. Then the input pulses can be at substantially the same intensity.

The two signal wavelengths $\lambda_{s1}$ and $\lambda_{s2}$ should be close to the same stimulated emission cross-section and gain profile along the fiber amplifying medium. However, these parameters need not be exactly the same. Differences in the two wavelengths' stimulated emission cross-section and gain profile can be partially compensated by adjusting the two signals' relative intensities so that signal with the lower stimulated emission cross-section and gain is balanced by a higher intensity in order to maintain the respective population inversion depletion rates for the two signals approximately the same. However, this compensation cannot be made completely perfect over the entire length of the fiber, so that the greater the difference in the two signals' stimulated emission cross section, the less will differences in input intensities of the two signals work to stabilize the pulse outputs independent of signal history.

Returning to FIG. 1, a photodetector can be placed in the path of the separated amplified light $\lambda_{s2}$ from the beamsplitter 39 to monitor the amplified output. If the pulse following a long duration pulse has decreased intensity, and inputs $\lambda_{a1}$ and $\lambda_{a2}$ have been adjusted for equal intensity, then this means that the separated signal $\lambda_{a2}$ is depleting the population inversion at a faster rate than the other signal $\lambda_{a1}$. The second signal source 31 can then be adjusted to shift its wavelength to a lower gain portion of the amplifying medium. Likewise, if the signal information is represented by pulse spacing and the pulse following a long interpulse interval has increased intensity, this means that the other signal has lower population depletion rate than the separated signal being monitored and the first signal source 29 needs to be adjusted to shift its wavelength to a higher gain portion of the amplifying medium. An alternative method of adjustment is to increase or decrease pulse intensity of a signal source 29 or 31 slightly to balance the lower or higher gain at its particular emission wavelength. However, changing only the relative input signal intensities works well only for low pulse modulation rates or short fibers, in which the pulse length is at least as long as the fiber amplifier, so that adjusting the overall gain in the fiber is effective.

Figure 4:
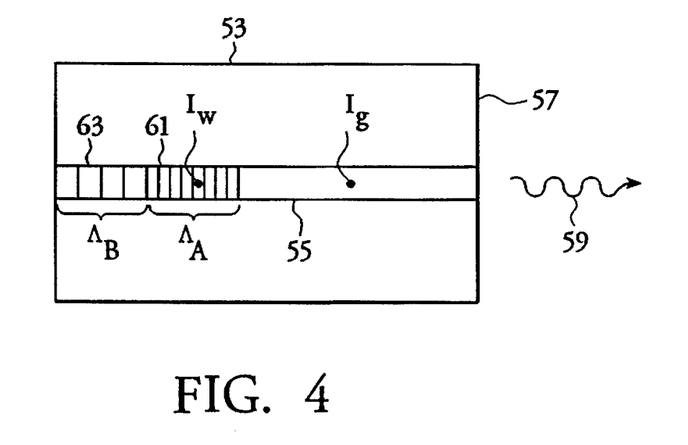
FIG. 4 is a top plan view of one possible frequency-switchable laser diode signal source for use in a fiber amplifier device of the present invention.
Figure 5:
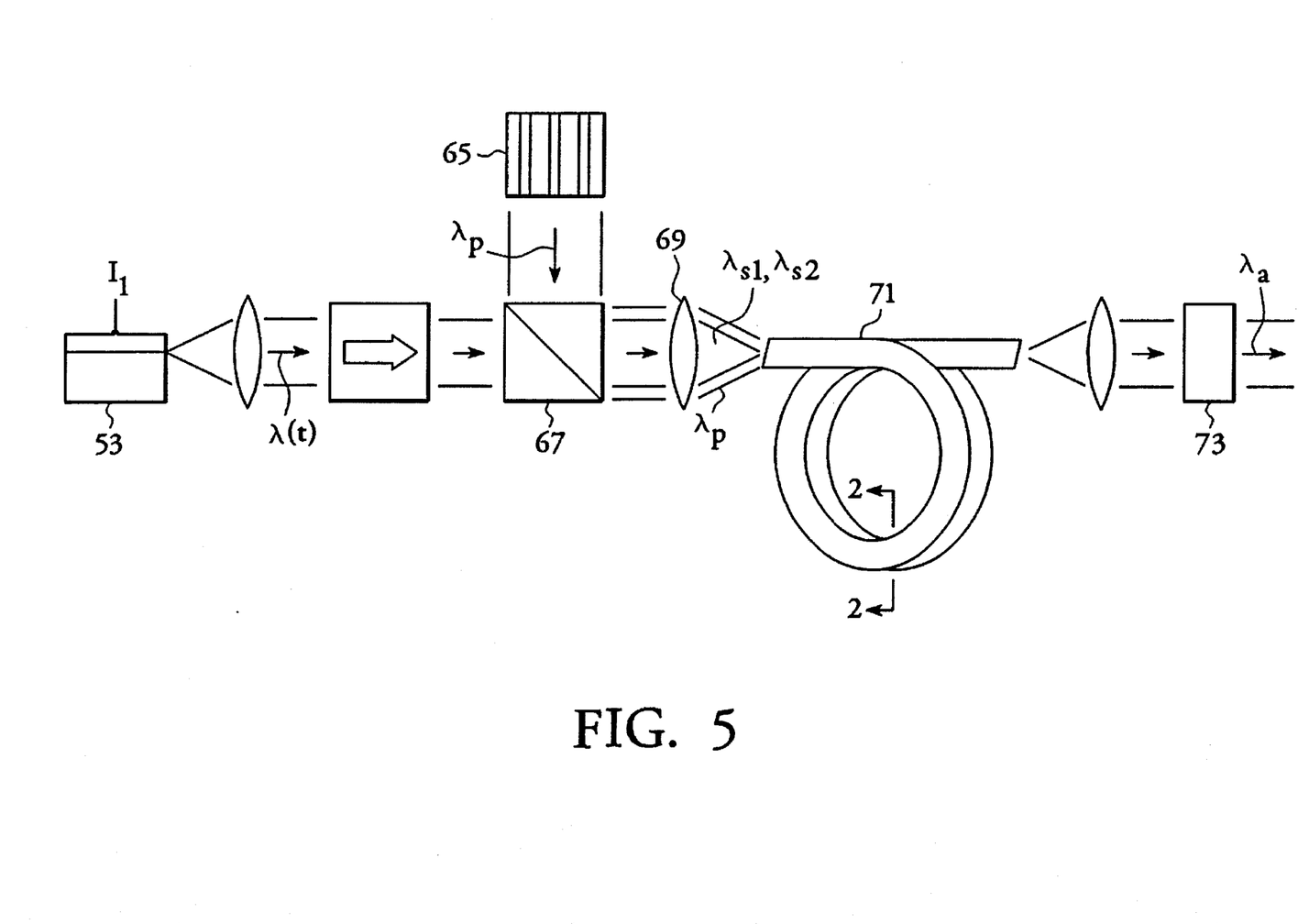
FIG. 5 is a schematic side view of another optical fiber amplifier device of the present invention using the frequency-switchable laser diode signal source of FIG. 4.

With reference to FIGS. 4 and 5, in another embodiment of the present invention, a single wave-length-switchable laser diode signal source 53 replaces the two separate signal sources 29 and 31 of FIG. 1. In FIG. 4, the signal source 53 is seen to include a gain region 55, typically defined by a single spatial mode waveguide, which supplies gain to the laser source 53 via injection of current $I_g$ through an active region of a semiconductor diode heterostructure. The device also includes a low reflectivity front facet 57 through which the laser light 59 is emitted and a pair of rear DBR gratings 61 and 63 providing reflective feedback of the light generated in the gain region 55 in a resonant cavity. The two gratings 61 and 63 have different grating pitches $\Lambda_A$ and $\Lambda_B$, and consequently have different reflectivity profiles versus wavelength. When the current $I_W$ supplied to the first grating 61 is low, the feedback results only from the first grating 61 with pitch $\Lambda_A$. The light never penetrates far enough to reach the second grating 63. The laser source thus emits at a first wavelength corresponding to the grating pitch $\Lambda_A$. When the current $I_W$ supplied to the first grating 61 is increased, the light penetrates the first grating 61 to reach the second grating 63 with its grating pitch $\Lambda_B$. The reflectivity of the second grating 63 is made higher than reflectivity of the first grating 61 so that when the light penetrates to the second grating 63 its reflection dominates and the laser emission switches to a second wavelength corresponding to the grating pitch $\Lambda_B$. The switching speed in this laser source is limited only by the RC constant of the contacts, and can be as high as 1 GHz. The spread $\Delta\lambda$ between the first and second wavelengths can be as high as the gain width of the laser material, which is typically about 50 nm.

Referring to FIG. 5, as in the previous embodiment, the signal light $\lambda(t)$ from the laser diode signal source 53 is directed along with pump light $\lambda_p$ from a high power pump source 65 through a dichroic beamsplitter combiner 67 and a focusing lens 69 into a fiber amplifying medium 71. The amplified light emitted from the fiber 71 may then be passed through a wavelength selective filter 73 or beamsplitter to remove one of the two wavelengths in the signal, leaving a single wavelength $\lambda_a$ pulse modulated signal for imaging on a printer drum or transmission along a fiberoptic communication line. Alternatively, the amplified wavelength-switched signal need not be immediately filtered for use by additional relay amplifiers along the communications fiber. Wavelength separation can then occur at the receiving end of the communications fiber.

Figure 6:
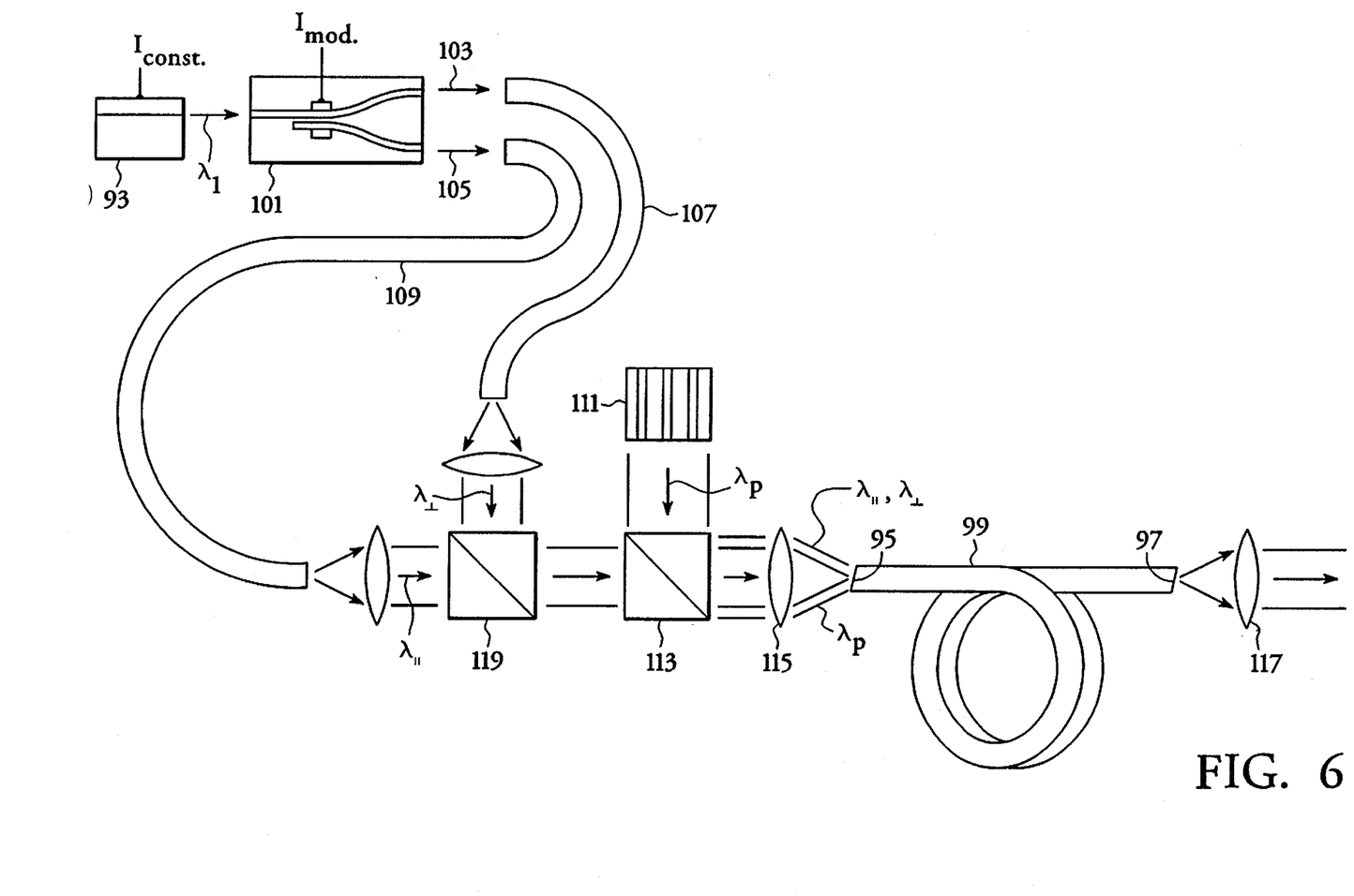
FIGS. 6 and 7 are schematic side views of two further embodiments of optical fiber amplifier devices of the present invention.

With reference to FIG. 6, yet another embodiment of the present invention directs two orthogonally polarized light beams split from a single laser diode source 93 alternately through the input end 95 of a fiber amplifying medium 99 by means of a directional coupler 101 responsive to a modulation signal $I_{mod}$. The laser diode 93 is supplied with a constant drive current $I_{const}$ and emits light of constant intensity with a wavelength $\lambda_1$ that is amplified in the fiber medium 99. Directional couplers 101 are commercially available. One type uses a one input, two output waveguide arrangement in which an electrical modulation signal $I_{mod}$ alters the refractive index of one waveguide or of a coupling region between two waveguide portions in order to cause light to leak from the one waveguide to another. With proper selection of the length of the coupling region and the amount of current or voltage in the applied electrical signal, all of the light in one waveguide can be made to switch to a second waveguide. The signal is emitted from the directional coupler 101 as a pair of complementary modulated light signals 103 and 105 which are coupled into transmission fibers 107 and 109. The two separate signals emitted from the transmission fibers 107 and 109 are coupled along with pump light $\lambda_p$ from a pump source 111 through a dichroic beamsplitter 113 and a focusing lens 115 into the input end 95 of the amplifying fiber 99 and are amplified within the fiber 99, emerging from the output end 97. There it is generally collimated by a lens 117 to form the output signal light $\lambda_a$. Prior to being combined with the pump beam $\lambda_p$, the two separated signal beams are recombined in a polarizing beamsplitter 119. The two optical signals which are combined in the beamsplitter 119 must have distinguishable optical polarizations $\lambda_{\parallel}$ and $\lambda_{195}$. This can be accomplished by using polarization preserving transmission fibers 107 and 109, where one fiber 107 or 109 is given a slow 90° twist to cause emission of light with a polarization direction $\lambda_\perp$ which is orthogonal to the other beam $\lambda_\parallel$. Alternatively, two linear polarization filters oriented at opposite 45° directions to the linear polarization of the two light signals 103 and 105 but at 90° to each other may be placed in the respective beam paths between the directional coupler 101 and the beamsplitter 119. This polarization switching scheme requires that amplifying fiber 99 also be a polarization maintaining fiber.

The following embodiment is generally useful only for low modulation rates or short fiber amplifiers, where the pulse interval is greater than, preferably much greater than, the pulse transit time through the fiber, so that the pulse length is at least as long as the fiber. Otherwise, the two oppositely propagating input signals which are intended to be complementary will only coincide at the center of the fiber and multiple pulses and interpulse intervals present in the fiber may actually increase the signal noise rather than the reverse. Small signal fiber amplifiers of about 1 m length can be used in communication systems for modulation rates of up to 150 or 200 MHz, but the high power fiber amplifiers used for printer applications have longer fibers, typically about 20 m long, limiting their modulation rate in the embodiment to about 10 MHz. For high modulation rates with the longer fibers, then, the previously described embodiments, in which both complementary signals are injected into the fiber amplifier from the same end and propagate together, should be used.

Figure 7:
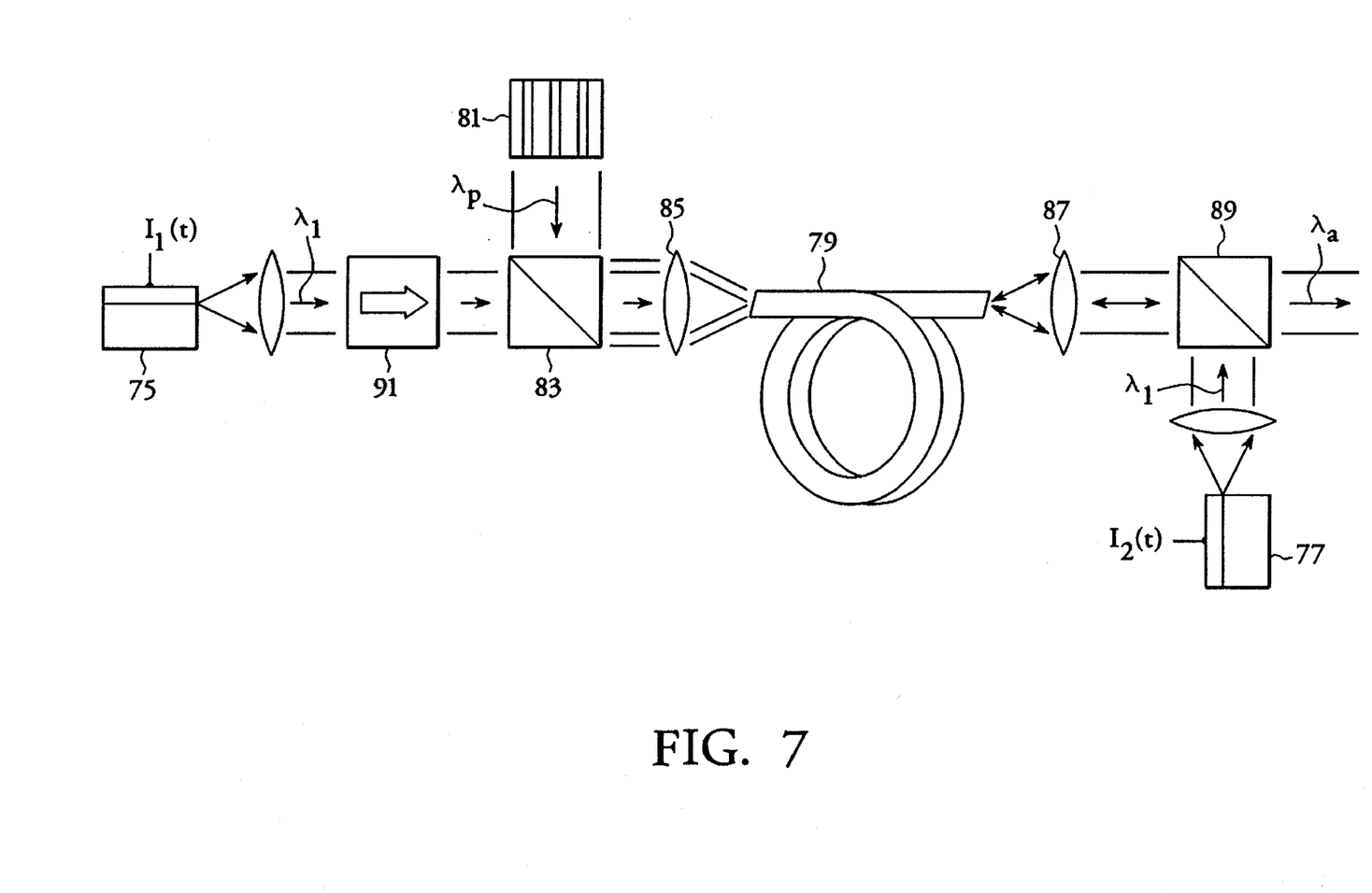

With reference to FIG. 7, in a fourth embodiment of the invention, the pair of laser diode signal sources 75 and 77 with distinguishable light emission characteristics are located at opposite ends of the fiber amplifying medium 79. The first signal source 75 is modulated by a current $I_1(t)$ and emits light at a wavelength $\lambda_1$. The modulated light, along with pump light $\lambda_p$ from a high power laser diode pump source 81, here shown as a monolithic laser array, are directed by a dichroic beamsplitter 83 and a focusing lens 85 into the input end of a relatively short (less than 20 m) optical fiber amplifying medium 79, which other than its length is like those previously described. The amplified signal is emitted from the output end of the fiber 79 and is collimated by a lens 87. The amplified first signal light emitted at the output end is transmitted through a polarizing beamsplitter 89 and forms the output signal $\lambda_a$. The second signal source 77 is modulated by a current $I_2(t)$ which is complementary to the current $I_1(t)$ applied to the first source 75. The second signal source 77 emits intensity modulated light at a wavelength $\lambda_1$, the same as the first signal source 75, but with a linear polarization direction which is orthogonal to the polarization of the first signal source's light emission. The polarizing beamsplitter 89 then reflects the second signal light through the lens 87 which focuses it into the 'output' end of the fiber amplifying medium 79. Alternatively, the second signal source 77 may emit light of a different wavelength from the light emitted by the first signal source 75, in which case a dichroic beamsplitter replaces the polarizing beamsplitter 89 in FIG. 6. The backward propagating second signal light is also amplified, so as to deplete the population inversion in the fiber 79 at a rate which is approximately equal to the population depletion rate of the complementary first signal light. An optical isolator 91 in the beam path of the first and second signal light prevents the amplified second signal from affecting operation of the first signal source 75.

We claim:
1. An optical amplifier, comprising
   an optical amplifying medium,
   means for optically pumping said optical amplifying medium, and
   a pair of laser signal sources with distinguishable light emission characteristics optically coupled to said optical amplifying medium, with means responsive to a modulation signal for switching emission in a complementary manner between said pair of laser signal sources such that total optical power from both modulated laser signal sources combined is substantially constant in time, said optical amplifying medium maintaining a population inversion spatial profile along a length of said optical amplifying medium approximately constant with time.

2. The optical amplifier of claim 1 wherein said amplifying medium is an optical fiber having a doped central core surrounded by at least one lower refractive index cladding, light emitted from said signal sources being coupled into said central core.

3. The optical amplifier of claim 1 wherein said amplifying medium is a glass rod doped with an active ionic species capable of undergoing stimulated emission.

4. The optical amplifier of claim 1 wherein said amplifying medium is a semiconductor amplifier.

5. The optical amplifier of claim 1 wherein said laser signal sources are laser diodes.

6. The optical amplifier of claim 1 wherein said distinguishable light emission characteristics of said pair of laser signal sources are different wavelengths.

7. The optical amplifier of claim 1 wherein said distinguishable light emission characteristics of said pair of laser signal sources are different polarizations.

8. An optical fiber amplifier, comprising
   an optical fiber amplifying medium,
   means for optically pumping said optical fiber amplifying medium, and
   a pair of laser diode signal sources with distinguishable light emission characteristics optically coupled to said optical fiber amplifying medium, with means responsive to a modulation signal for switching emission in a complementary manner between said pair of laser diode signal sources such that total optical power from both modulated laser diode signal sources combined is substantially constant in time, said optical fiber amplifying medium maintaining a population inversion spatial profile along a length of said optical fiber amplifying medium approximately constant with time.

9. The fiber amplifier of claim 8 wherein said distinguishable light emission characteristics of said pair of laser diode sources are different wavelengths.

10. The fiber amplifier of claim 9 wherein said pair of laser diode signal sources emit light with different wavelengths corresponding to substantially the same gain within said optical fiber amplifying medium to within 2%.

11. The fiber amplifier of claim 8 wherein said distinguishable light emission characteristics of said pair of laser diode signal sources are different polarizations.

12. The fiber amplifier of claim 8 further comprising light separation means optically coupled to an output end of said optical fiber amplifying medium for substantially transmitting light having characteristics corresponding to one of said pair of laser diode signal sources and substantially blocking transmission of light having characteristics corresponding to the other of said pair of laser diode signal sources.

13. The fiber amplifier of claim 12 wherein said distinguishable light emission characteristics of said pair of laser diode sources are different wavelengths, said light separation means being a wavelength filter.

14. The fiber amplifier of claim 12 wherein said distinguishable light emission characteristics of said pair of laser diode signal sources are different linear polarizations, said light separation means being a polarization filter.

15. The fiber amplifier of claim 12 further comprising means, optically coupled to said light separation means, for monitoring amplified light corresponding to one of said pair of laser diode signal sources and for providing a feedback signal to at least one of said signal sources.

16. The fiber amplifier of claim 8 wherein said pair of laser diode signal sources emit light with substantially the same wavelength, said light from said pair of sources being coupled into said optical fiber amplifying medium from opposite ends thereof, said modulation signal having a sufficiently low modulation rate such that pulse lengths of said light from said signal sources are at least as long as the length of said optical fiber amplifying medium.

17. The fiber amplifier of claim 8 wherein said optical fiber amplifying medium has a rare-earth-doped central core surrounded by a lower refractive index inner cladding region in turn surrounded by an outer cladding region, pump light being coupled into said inner cladding region and light from said pair of laser diode signal sources being coupled into said central core.

18. The fiber amplifier of claim 8 wherein said optical fiber amplifying medium has at least one angled end surface.

19. The fiber amplifier of claim 8 wherein said modulation signal is a digital pulse modulation signal.

20. The fiber amplifier of claim 19 wherein said means for switching comprises means for amplitude modulating the light emission from said pair of laser diode signal sources in a complementary manner such that one and only one laser diode signal source couples light into said optical fiber amplifying medium at any given time.

21. The fiber amplifier of claim 8 wherein said modulation signal is an analog signal.

22. The fiber amplifier of claim 21 wherein said means for switching comprises means for amplitude modulating the light emission from each of said pair of laser diode signal sources in a complementary manner such that whenever the amplitude modulated light emission from one source is increasing in intensity, the amplitude modulated light emission from the other source is necessarily decreasing in a corresponding manner, and vice versa.

23. An optical amplifier, comprising
an optical amplifying medium,
means for optically pumping said optical amplifying means, and
a laser signal source optically coupled to said optical amplifying medium, with means responsive to a digital modulation signal for switching a light emission of said laser signal source between two wavelengths, the optical power output at both wavelengths being always such that a rate of depletion of excited states at each point in the amplifying medium is substantially constant in time and matched by an equal rate of excitation by said pumping means, said optical amplifying medium maintaining a population inversion spatial profile along a length of said optical amplifying medium approximately constant with time.

24. The optical amplifier of claim 23 wherein said amplifying medium is an optical fiber having a doped central core surrounded by at least one lower refractive index cladding, light emitted from said signal source being coupled into said central core.

25. The optical amplifier of claim 23 wherein said amplifying medium is a glass rod doped with an active ionic species capable of undergoing stimulated emission.

26. The optical amplifier of claim 23 wherein said amplifying medium is a semiconductor amplifier.

27. The optical amplifier of claim 23 wherein said laser signal source is a DBR laser diode.

28. An optical fiber amplifier, comprising
an optical fiber amplifying medium,
means for optically pumping said optical fiber amplifying means, and
a laser diode signal source optically coupled to said optical fiber amplifying medium, with means responsive to a digital modulation signal for switching a light emission of said laser diode signal source between two wavelengths, the optical power output at both wavelengths being always such that a rate of depletion of excited states at each point in the amplifying medium is substantially constant in time and matched by an equal rate of excitation by said pumping means, said optical fiber amplifying medium maintaining a population inversion spatial profile along a length of said optical fiber amplifying medium approximately constant with time.

29. The fiber amplifier of claim 28 wherein light of both wavelengths from said laser diode signal source have intensity and gain within said optical fiber amplifying medium that are both substantially the same to within 2%.

30. The fiber amplifier of claim 28 further comprising a wavelength filter optically coupled to an output end of said optical fiber amplifying medium for substantially transmitting one of said two wavelengths of said laser diode signal source and substantially blocking transmission of the other of said two wavelengths.

31. The fiber amplifier of claim 28 wherein said optical fiber amplifying medium has a rare-earth-doped central core surrounded by a lower refractive index inner cladding region in turn surrounded by an outer cladding region, pump light being coupled into said inner cladding region and light from said laser diode signal source being coupled into said central core.

32. The fiber amplifier of claim 28 wherein said optical fiber amplifying medium has a least one angled end surface.

33. The fiber amplifier of claim 28 wherein said modulation signal is a digital pulse modulation signal.

34. The fiber amplifier of claim 28 wherein said laser diode signal source comprises a DBR laser diode having two grating reflectors arranged in tandem at one end of a laser cavity with reflective responses respectively corresponding to said two wavelengths, and means for selectively tuning an innermost one of said grating reflectors in said cavity to transparency.

35. An optical fiber amplifier, comprising
an optical fiber amplifying medium,
means for optically pumping said optical fiber amplifying medium,
a laser diode emitting light of constant intensity, and
means, optically coupled to said laser diode to receive said emitted light therefrom and optically coupled to said optical fiber amplifying medium for delivering the received light thereto, and responsive to a digital modulation signal for switching the light delivered to said optical fiber amplifying medium between two different polarizations, said optical amplifying medium maintaining a population inversion spatial profile along a length of said optical fiber amplifying medium approximately constant with time.

36. The fiber amplifier of claim 35 wherein said polarization switching means comprises a directional coupler with an input receiving said light emitted from said laser diode and with a pair of outputs, said directional coupler responsive to said digital modulation signal so as to switch said light received at said input between said pair of outputs, and means coupled to said pair of outputs of said directional coupler and to said optical fiber amplifying medium for altering a polarization of light from at least one of said outputs prior to delivery to said optical fiber amplifying medium.

37. The fiber amplifier of claim 36 wherein said polarization altering means comprises a pair of polarization preserving optical fibers, at least one of said fibers being twisted axially such that the polarization of light emitted from one fiber is orthogonal to the polarization emitted from the other fiber.

38. The fiber amplifier of claim 36 wherein said polarization altering means comprises a pair of polarization filters placed in a path of light between said respective directional coupler outputs and said optical fiber amplifying medium, said filters oriented with polarization diameters orthogonal to each other and each 45° relative to a polarization direction of light emitted from said directional coupler outputs.

39. A light transmission system for a digital data stream, comprising
an optical fiber transmission medium,
a pair of laser light sources with distinguishable light emission characteristics optically coupled to said optical fiber transmission medium, and
bipolar modulation means connected to said light sources for switching emission between the two distinguishable characteristics in a complementary manner in response to a serial stream of digital data, light output existing at all times from one and only one source at a time.

40. The system of claim 39 wherein said optical fiber transmission medium includes an optically pumped light amplifying medium.

41. The system of claim 40 wherein said amplifying medium comprises a rare-earth-doped central core surrounded by at least one lower refractive index cladding.

42. The system of claim 40 wherein said distinguishable light emission characteristics of said pair of laser diode light sources correspond to substantially the same gain within said amplifying medium.

43. The system of claim 39 wherein said distinguishable light emission characteristics of said pair of laser diode light sources comprise different wavelengths.

44. The system of claim 39 wherein said distinguishable light emission characteristics of said pair of laser diode light sources comprise different polarizations.

45. The system of claim 39 wherein the combined output power from both laser diode light sources is substantially constant in time.

46. A method of optical digital transmission of serial data comprising
providing first and second switchable laser diode light sources having distinguishable light emission characteristics,
switching in a complementary manner between the first and second sources corresponding to digital one and zero, respectively, in a serial data stream, whereby light output always exists from one and only one source at a time,
directing the output of the first and second sources into a fiber optic transmission line.

47. The method of claim 46 wherein said distinguishable light emission characteristics of said first and second laser diode light sources comprise different wavelengths.

48. The method of claim 46 wherein said distinguishable light emission characteristics of said first and second laser diode light sources comprise different linear polarizations.

49. The method of claim 46 wherein the combined output power from both laser diode light sources is substantially constant in time.

50. The optical amplifier of claim 1 wherein said modulation signal is a serial stream of digital data, wherein said switching means responsive to said modulation signal is means for modulating said pair of laser signal sources such that the sources emit complementary streams of optical pulses corresponding to said digital data, the complementary streams of optical pulses being such, that whenever one laser signal source emits substantially zero optical power, the other laser signal source of said pair necessarily emits an optical pulse, so that there is always one and only one optical pulse from the pair of sources coupled into said amplifying medium, and wherein an output end of said optical amplifying medium is optically coupled to an optical fiber transmission medium to receive at least one of said complementary streams of optical pulses after amplification by said optical amplifying medium.

51. The optical amplifier of claim 1 wherein said modulation signal is a serial stream of digital data, said switching means providing for switching emission between said distinguishable light emission characteristics in a complementary manner in response to said serial stream, and an output end of said optical amplifying medium optically coupled to an optical fiber transmission medium to receive light output from only one of said laser signal sources at a time.

* * * * *